US012525695B2

(12) United States Patent
Kuban et al.

(10) Patent No.: US 12,525,695 B2
(45) Date of Patent: Jan. 13, 2026

(54) HOUSING FOR A LUMINAIRE WITH A SIGNAL LINE HAVING A CONDUCTOR INTEGRATED WITH A DIELECTRIC, WHICH IS ATTACHED TO THE HOUSING BY AN ADHESIVE TAPE

(71) Applicants: ZUMTOBEL LIGHTING GMBH, Dornbirn (AT); TRIDONIC GMBH & CO KG, Dornbirn (AT)

(72) Inventors: Marek Kuban, Dornbirn (AT); Stefan Lorenz, Schwarzenbruck (DE); Markus Mayrhofer, Dornbirn (AT); Mario Pöhs, Dornbirn (AT); Thomas Zengerle, Kennelbach (AT); Patrik Yves Koch, Langenargen (DE); Frank Lochmann, Achberg (DE); Patrick Schnell, Eriskirch (DE); Lukas Simma, Hohenweiler (AT)

(73) Assignees: Zumtobel Lighting GmbH, Dornbirn (AT); Tridonic GmbH & Co KG, Dornbirn (AT)

( * ) Notice: Subject to any disclaimer, the term of this patent is extended or adjusted under 35 U.S.C. 154(b) by 423 days.

(21) Appl. No.: 18/040,277

(22) PCT Filed: Aug. 2, 2021

(86) PCT No.: PCT/EP2021/071594
§ 371 (c)(1),
(2) Date: Feb. 2, 2023

(87) PCT Pub. No.: WO2022/029092
PCT Pub. Date: Feb. 10, 2022

(65) Prior Publication Data

US 2023/0265990 A1 Aug. 24, 2023

(30) Foreign Application Priority Data

Aug. 7, 2020 (EP) .................................... 20190103
Dec. 30, 2020 (GB) .................................... 2020713

(51) Int. Cl.
*H01P 3/08* (2006.01)
*F21V 15/01* (2006.01)

(52) U.S. Cl.
CPC .............. *H01P 3/081* (2013.01); *F21V 15/01* (2013.01); *H05K 2201/0999* (2013.01)

(58) Field of Classification Search
CPC .................................. H01P 3/081; H01P 3/08
(Continued)

(56) References Cited

U.S. PATENT DOCUMENTS 3,496,492 A * 2/1970 Kurzl et al. .............. H01P 5/08 333/116
5,652,557 A * 7/1997 Ishikawa ................. H01P 3/081 333/246

(Continued)

FOREIGN PATENT DOCUMENTS

DE 10 2018 203508 A1 9/2019
JP 2019149308 A 9/2019

OTHER PUBLICATIONS

PCT/EP2021/071594, International Search Report and Written Opinion, Nov. 11, 2021, 15 pages.

*Primary Examiner* — Benny T Lee
(74) *Attorney, Agent, or Firm* — Andrus Intellectual Property Law, LLP

(57) ABSTRACT

A housing for a luminaire or an operating device for the luminaire, wherein the housing is configured to accommodate at least one electronic component and/or a light source, and comprising a conductive housing component (2). The housing includes at least one line (1, 1', 1", 1''', 1"") for
(Continued)

transmitting electric high frequency signals or for transmitting and/or receiving radio waves. The transmission line is formed by arranging a dielectric layer (4, 4*a*, 4*b*, 9) and a conductor (3, 3 . . . 3*c*, 7) on the housing component (2) such that the conductive housing component (2) serves as a reference plane, and the conductive housing component (2) and the conductor (3, 3 . . . 3*c*, 7) sandwich the dielectric layer (4, 4*a*, 4*b*, 9).

16 Claims, 6 Drawing Sheets

(58) Field of Classification Search
USPC .......................................................... 333/238
See application file for complete search history.

(56) References Cited

U.S. PATENT DOCUMENTS

| | | | |
|---|---|---|---|
| 6,144,268 A | 11/2000 | Matsui et al. | |
| 6,384,345 B1 | 5/2002 | Akiha | |
| 2016/0123569 A1 | 5/2016 | Cummings | |
| 2019/0312346 A1 | 10/2019 | Wang et al. | |
| 2020/0076035 A1* | 3/2020 | Huh et al. | H01P 3/082 |

* cited by examiner

HOUSING FOR A LUMINAIRE WITH A SIGNAL LINE HAVING A CONDUCTOR INTEGRATED WITH A DIELECTRIC, WHICH IS ATTACHED TO THE HOUSING BY AN ADHESIVE TAPE

CROSS-REFERENCE TO RELATED APPLICATION

The present application is the U.S. national stage application of international application PCT/EP2021/071594 filed Aug. 2, 2021, which international application was published on Feb. 10, 2022 as International Publication WO 2022/029092 A1. The international application claims priority to British Patent Application 2020713.0, filed Dec. 30, 2020 and European Patent Application No. 20190103.0, filed Aug. 7, 2020.

TECHNICAL FIELD OF THE INVENTION

The invention regards a housing with an integrated line for enabling a wired or wireless signalling and a luminaire with such a housing.

BACKGROUND OF THE INVENTION

Information processing becomes more and more important in nearly any technical area. Processing performance increased over the last decades to such an extent that nearly every technical development makes use of analysis of information received, for example, from sensors connected to a device. However, it is not reasonable to provide every device, or rather its processor, with dedicated sensor signals. Thus, systems have been developed where a plurality of information processing devices are connected via a network. Such a network enables the devices to communicate with each other thereby reducing the need for redundant sensors, for example. Further, controls of devices may interact with each other by exchanging information so that controlling the devices can be adapted for commonly achieving a specific task.

Unfortunately, establishing such networks or, to be more general, communication systems, usually causes additional costs, needs space for integration and apparatuses and finally still offers limited performance. A higher interaction of devices of distributed systems, for example in the building, is desired and consequently lighting systems have been identified as offering advantageous prerequisites for supporting cabling using the mechanical structure of luminaires. Using a lighting system for distributing and collecting information all over a building has the advantage that the lighting installation anyway provides a distributed grid.

Nevertheless, there are some drawbacks current lighting systems have. First, transmission of information or data is usually performed by using extra cabling that is mounted in, for example, a luminaire and which is used to transmit signals from one electronic component to the other. Point to point connections like contemporary Ethernet, or optical cables obviously have the disadvantage of an increasing amount of extra cabling in case of a plurality of components communicating with each other. It is desirable to reduce the costs and space needed for such extra cabling while at the same time to improve flexibility of positioning involved components. Bus systems have been developed such as the Digital Addressable Lighting Interface (DALI) system which could at least reduce the amount of additional cables needed.

Other solutions use existing cabling. One example is power line communication. Of course, the additional cabling can be avoided or at least reduced. But powerline communication is impeded by high frequency losses and consequently limits in transmission speed over long distances are unavoidable.

SUMMARY OF THE INVENTION

Having in mind all these drawbacks of solutions known from the state in the art it is evident that there is a need for improvement for enabling communication of electronic components.

The goal is achieved with the inventive housing for a luminaire or an operating device for the luminaire and the respective luminaire according to the independent claims. With the present invention, the versatile line for transmitting data signals with high speed and bandwidth or for transmitting and/or receiving radio waves is integrated into a luminaire using its conductive housing component. Many luminaires have metallic housing components, which can serve as the conductive housing component according to the invention. Luminaires are distributed over buildings and even outside areas and thus offer an advantageous structure for transmitting information signals. This is particularly true in case of trunking lighting systems or light tracks (light rails) that allow transmitting signals over a long distance and in many places internally within the track. Trunking lighting systems typically may extend up to lengths of 100 m or the like.

The luminaire according to the invention comprises a housing in which at least one electronic component and/or a light source are accommodated. Transmission of signals to or from the electronic component is performed using a line, which is, according to the invention, formed by arranging a dielectric layer and a conductor on the conductive housing component. As the conductive housing component, for example, a metallic housing component, supports the dielectric layer and the conductor such that the line suitable for transmitting high frequency electric signals is established. This line can then be used in order to transmit signals to or from the electronic component contacting the line to receive signals from or transmit signals to the line or transmit and/or receive radio signals (radio waves). The conductive housing component serves as a reference plane (sometimes also ground plane) for the line.

As can be easily understood from above explanations of the main structure of the inventive housing for a luminaire or an operating device and the respective luminaire itself, a high degree of integration is achieved by using the conductive characteristic of the housing component for establishing a line for high frequency signal transmission. In case of a wired signalling, the need for mounting additional cables for enabling signal transmission within the luminaire or even accommodating wireless communication is thus not needed anymore. This significantly reduces costs by avoiding additional work in a manufacturing process. The line attached to the housing component furthermore allows to be contacted by the electric components accommodated in the housing of the luminaire using the line for transmission or reception at arbitrary positions. Having in mind that often designers require a high degree of flexibility to arrange components inside the luminaire, the variety of luminaires that can be designed using this structure for data transmission lines is increased. Particularly, when a plurality of electronic components communicating with each other must be arranged in the luminaire, distribution of the components can be achieved without an adaptation of, for example, existing cabling. Further, no standardized connectors have to be used as the surface of the line, namely the conductor, can be directly contacted at its surface. In case of wireless signalling, an antenna is formed by the conductor and the dielectric layer arranged on the conductive housing component. In this way, the performance of the antenna can be increased, wherein the antenna can be placed in an optimum position inside or outside the housing.

Further advantageous aspects and details are defined in the dependent claims.

For further cost reduction, it is preferred to use an existing or usually needed coating of the conductive housing component as dielectric layer. Such a coating may be a powder coating applied to the conductive material of the housing component or a paint, foil, or a suitable anodization, for example. Any kind of coating that can be applied to the conductive material of the conductive housing component can be used. The thickness of such a coating shall be adjusted in order to have reasonable values based on the dielectric constant of the used material. Further, in order to achieve characteristics comparable to a microstrip created on a printed circuit board, application of the coating must fulfil requirements regarding variation of thickness in the direction in which the line is formed. However, it is not necessary that constant thickness is achieved all over the conductive housing component, because areas distant from the line may show an increase or reduction of thickness, which does not badly affect the characteristics of the line. For example, a reduced layer thickness at edges of a surface where the line is formed, may not disturb signal transmission. So positioning the line in an area of the conductive housing component where application of a coating can be achieved with sufficiently constant thickness supports generating a transmission line having the desired electromagnetic or electrodynamic characteristics.

Further, it is to be noted that such a coating does not necessarily need to constitute the entire dielectric layer between the conductor and the conductive material of the housing component. For example, in case that the conductive housing component is coated in the manufacturing process it is still possible to add a further dielectric material on the surface of the coating. In such a case, the dielectric layer consists of two sub layers, the first being formed by the coating of the conductive housing and the second by an additional dielectric material. Preferably, the additional material is an adhesive tape attached to the housing component. Of course, it is also possible to use only such an adhesive tape as the dielectric layer. Using adhesive tapes has the advantage that the application of such a tape is very easy and tapes are available in various different materials and with different dimensions so that the dielectric constant can be easily selected appropriately. The manufacturing process is very easy and flexible, because tapes can be applied on almost every side or surface of the conductive housing component.

Alternatively, an adhesive film may be applied directly on the metal tape, without a separate dielectric carrier. This embodiment may use the adhesive coating of the metal band as dielectric.

Furthermore, adhesive tapes can be produced already carrying the conductor. An adhesive tape consisting of the adhesive and a dielectric support structure on top of which the conductor is already mounted, will result in the desired line on the conductive housing component in only one manufacturing step which is the application of the adhesive tape on a suitable surface of the housing. Adhesive tapes already carrying a conductor are available on the market. Such tapes can be cut to the desired lengths thereby enabling an adaptation to different housings, easily.

Alternatively, the conductor can be applied in a separate manufacturing process and using a different technique, after the dielectric layer has already been attached or applied on the respective surface of the conductive housing component. The conductor can be applied, for example by chemical or physical vapor deposition of a metal (sputtering), drawing a line of conductive ink, or attaching a metal foil, in an independent application step from sticking the adhesive tape mentioned above. All these techniques allow an easy control of the desired dimensions of the conductor and dielectric layer, so that an adaptation of the electric characteristics of the line can be made according to the specific application.

Alternatively or in addition, the conductor can be completely enclosed by dielectric layers, wherein the dielectric layer and at least another dielectric layer sandwich the conductor. The dielectric layers can be realized using (self-adhesive) films/foils, wherein the films enclosing the conductor form an adhesive tape.

It is particularly preferred that the housing component comprises a flat section to which the dielectric layer and the conductor are attached so as to establish a transmission line and/or an antenna, in particular a microstrip patch antenna. A transmission line such as a microstrip has well-known electrical (e.g. electromagnetic and electrodynamic) characteristics and has proven to be capable of satisfying the highest demands regarding signal transmission with low RF losses. Further, the dimensions needed for the dielectric layer and the conductor are very small compared to typical dimensions of housing components of a luminaire. As a consequence, creating a transmission line by using the conductive housing component as a reference plane achieves a high degree of integration of a communication line in the luminaire structure without the need of additional space. The antenna can be a monopole antenna or a dipole antenna.

Alternatively or in addition, the transmission line can be a connection line of the antenna.

Preferably, the transmission line can form a coplanar waveguide, in which the conductor together with a pair of return conductors sandwiching the conductor are arranged on the same side of the dielectric layer and the conductive housing component serves a third return conductor.

Further, the transmission line may be enhanced by adding at least one further line that could be attached on top of the first line for a stacked arrangement, be twisted with the first line or arranged side-by-side with the first line. Using such a second line would enable to transmit differential signals.

A further improvement of the characteristics can be achieved with a projection that is formed on the conductive housing component projecting from the same surface to which the dielectric layer and the conductor are attached. Different shapes of the ground plane can easily be provided during the manufacturing process of the housing component. Typical manufacturing processes of the housing of luminaires are extrusion, deep drawing of a metal sheet or any other kind of sheet metal forming. It is specifically preferred if the protrusion simultaneously serves a structural purpose, for example enhancing rigidity of the housing component. Thus, the protrusion may be formed as a corrugation or rib.

Instead of forming a flat transmission line like a microstrip line using a flat or only slightly curved surface of the conductive housing component, it is also possible that the transmission line is formed as a 3D-line with a portion of the housing surrounding the conductor at least partially in cross section. The resulting 3D-line approximates the geometry of a coaxial a coaxial transmission line integrally formed using the conductive housing component as an outer shield and reference of the coaxial cable. Such a structure may preferably be established in an inner corner of the housing, when the housing is seen in cross section.

Preferably, at least one connector is provided at or in the housing contacting the line and enabling another line and/or an electronic component of the luminaire to connect to the line for feeding the line with a signal and/or receiving a signal from the line. The connector can make use for example known techniques like linear microstrip dividers, circular power dividers or other known forms of power splitters. Further, a direct contact with the open surface of the conductor, which is the surface side facing away from the ground plane, can be made using a spring loaded metal contact (e.g. a Pogo Pin™ spring loaded metal contact)), a conductive polymeric contact or a metal spring, pressing on the open surface of the conductor. Alternatively, capacitive or inductive coupling can be used.

Specifically, when the element making the mechanical contact or establishing the contactless coupling could be directly included in the electronic components to be connected to the line. Then, it is only necessary to position the electronic component in the housing such that the contacting or coupling elements is positioned at the line to make a direct mechanical contact or enable conductive or capacitive coupling.

According to another aspect, the housing has a modular structure comprising a plurality of housing components commonly forming a ground plane of the line established by commonly arranging a dielectric layer and a conductor on the housing components. In such a case it is possible to combine a plurality of different modules (conductive housing components) first, and then attach the dielectric layer and conductor on the combined and electrically connected modules. This allows to mount the housing with its final shape for example on the ceiling of a building and then attach the dielectric layer and the conductor to establish the line finally used for communication between a plurality of different electronic components. Specifically, if the transmission line is formed by using an adhesive tape as a dielectric layer carrying the conductor already, the line can be created when mounting the lighting system. Not only that no connector between dielectric layers sections and conductor sections of different modules is necessary but also an attachment of the adhesive tape for generating the line is only necessary when the respective luminaire needs a line for communication or signalling.

Alternatively, a modular housing comprises a plurality of housing components each forming a reference plane of respective line sections wherein the line sections of the plurality of housing components are connected with each other to realize the entire line. In such a case, no application of the dielectric layer and the conductor is needed at the construction site, where usually dust is a problem so that attaching an adhesive tape may cause additional effort to clean and prepare the surface on the conductive housing component.

Finally, ground of the electronic component of the luminaire advantageously is connected to the metallic housing component. This results in involved electric components and the line having the same electric potential as ground. Adjustments of impedance can easily be achieved resulting in improved reflection characteristics when transmitting signals over the line. As the reference plane of the line is part of the housing of the luminaire, it is easy to connect electronic components of the luminaire with the metallic housing component as well so that no additional ground connector or terminal for connection of the line is necessary.

BRIEF DESCRIPTION OF THE DRAWINGS

The structure of the housing including a line according to the invention in a plurality of different embodiments of such integrated lines transmitting microwave or radiofrequency signals in a luminaire will now be explained with reference to the attached drawings in which.

DETAILED DESCRIPTION OF THE PREFERRED EMBODIMENT

The same features are denoted by the same reference signs throughout all figures.

Figure 1:
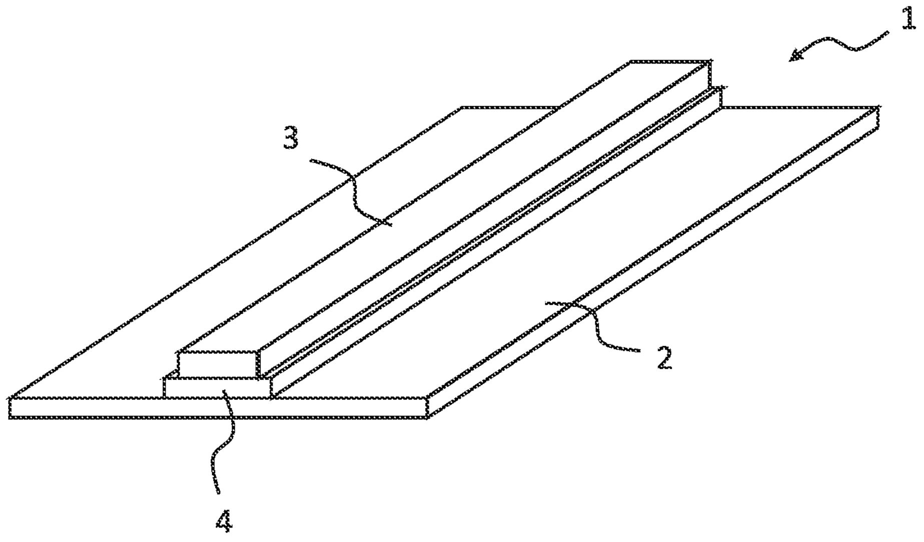
FIG. 1 shows a general structure of a line according to the invention using a conductive housing component as ground plane.

The general structure of a line formed on a portion of a housing of a luminaire will now be explained with reference to FIG. 1. FIG. 1 shows a perspective illustration of a line 1 as one preferred example of the line according to the invention. The line 1 is generated using a conductive housing component 2 of a housing of a luminaire. Since the housing component can be any part of the conductive housing of the luminaire and for an easier understanding of the drawing, other components of the luminaire are not illustrated in the drawing.

The conductive housing component 2 may be, for example, a metallic body of luminaire, such as a light rail manufactured as extruded metal or deep drawn metal sheets. It is to be noted that the particular way of manufacturing the housing component is not relevant for the invention as long as a reasonable shaped surface is generated and the housing component is made of conductive material. Further, the surface of the conductive housing component 2 visible in FIG. 1 may be an outside surface of the conductive housing component or a surface oriented towards the inside of the housing of the luminaire.

Using an outward oriented surface of the conductive housing component 2 has the advantage that the line may also be created after the conductive housing component has been mounted, for example, on a ceiling of the building. Of course, generating the line may also be performed on an inner surface of the conductive housing component 2. Examples for different positions on a housing of a luminaire will be explained in greater detail below with reference to FIG. 7.

The conductive housing component 2 has a flat surface on which a dielectric layer 4 is arranged. Application of the dielectric layer 4 may be achieved by sticking an adhesive tape to the surface of the conductive housing component 2. Other techniques may also be used as long as it can be ensured that the dimensions of the dielectric layer 4, particularly its thickness, can be controlled with sufficient accuracy.

A conductor 3 is attached on top of the surface of the dielectric layer 4 being oriented away from the conductive housing component 2. The conductor 3 may be made from arbitrary conductive material, in a preferred embodiment copper is used as conducting material for the conductor 3.

The dielectric layer 4 and the conductor 3 may be applied in a single manufacturing step. For example, the conductor 3 is attached to an adhesive tape made from dielectric material and forming, after sticking the adhesive tape to the surface of the conductive housing component 2, the dielectric layer 4. Alternatively, the dielectric layer 4 and the conductor 3 may be generated on the surface of the conductive housing component 2 in two successive manufacturing steps.

It is particularly preferred that the dielectric layer 4 is made from a material that is simultaneously used for protecting the surface of the conductive housing component 2 or even for optical reasons. Often, such protective layers are formed on the outer surface of a housing component but also on the inner surface of the housing of the luminaire in order to cover the entire surface of the housing. Preferred techniques are powder coating, spray painting, or anodizing. These techniques allow controlling the thickness of the layer with sufficient precision in order to use it, having knowledge of the dielectric constant of the material used, as the dielectric layer 4 for a line having a structure as shown in FIG. 1.

In case that such a coating of the conductive housing component 2 is used as a dielectric layer 4, the coated housing is then used as a substrate for attaching the conductor 3. The conductor 3 can be attached to the coated conductive housing component 2 by sticking an adhesive metal foil as conductor 3 on top of the coating, drawing a line using conductive ink or using vapor deposition techniques for sputtering metal particles to generate the conductor 3. Specifically the latter technique allows to use masks for generating arbitrary shapes of the conductor 3, thereby not only generating a line for transmitting microwave or radiofrequency signals along the extension of the housing of the luminaire but also creating electronic components such as power dividers or the like.

Electrical characteristics of lines that may typically be used for communication within a luminaire may typically be achieved with dimensions of the dielectric layer 4 and the conductor 3 that can easily be realized, even on small housing components and limited flat or almost flat portions of the housing component. For example, an impedance of 75 ohms for the transmission line can be achieved by using a metal luminaire housing component 2 with a powder coating having a thickness of 100 μm and a conductor thickness of 35 μm. A width of 0.075 mm of the conductor 3 then leads to an overall impedance of 75 Ohms assuming the dielectric constant of the powder coating being 4. The dimensions given above as an example can be realized by applying a selected foil or applying a single strand of wire having a diameter of 0.1 mm resulting in an impedance of 62 Ohms. As mentioned above already, alternative techniques for applying the metallic conductor 3 are physical or chemical vapor deposition, laser scribing or sintering, which all can be used in order to apply a metallic conductor 3 having the desired dimensions.

Figure 2:
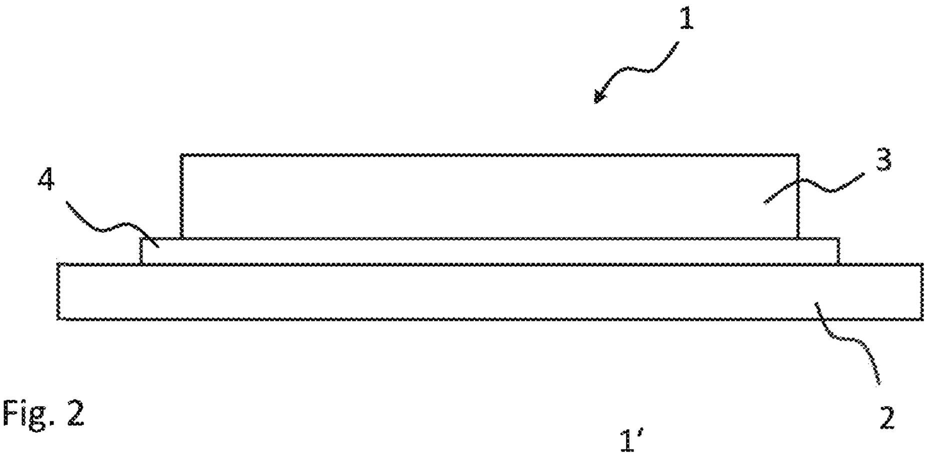
FIG. 2 shows a cross-section of the first embodiment of a line formed as a microstrip transmission line.

A cross-section of the simple version of a transmission line 1 (microstrip 1) shown in the perspective illustration in FIG. 1 is shown in FIG. 2. It is to be noted that in all the described and illustrated embodiments, the dimensions of the different layers (conductive housing component, dielectric layer and conductor) and, particularly the overall dimension of the conductive housing component 2 is not limiting. The skilled person will easily understand that the conductive housing component 2 may be any part of the housing that offers sufficient surface area to apply the dielectric layer 4 and the conductor 3. Although it is described to generate a transmission line by sandwiching the dielectric layer 4 between the conductor 3 and the conductive housing component 2 by attaching the dielectric layer 4 and the conductor 3 to a flat portion of the conductive housing component 2, the surface does not need to be entirely flat. Even slightly curved surfaces may be used, although, application of the dielectric layer 4 and the conductor 3 may be a little bit more difficult. However, even application of the dielectric layer 4 and the conductor 3 on a curved surface of the conductive housing component 2 is considered to create a transmission line 1 in the sense of the present invention.

Figure 3:
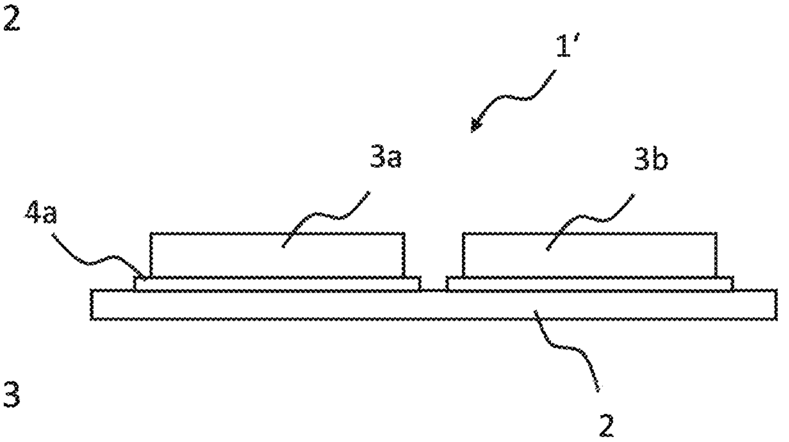
FIG. 3 shows a cross-section of a second embodiment adapted for transmitting differential signals.

Often it is desired to transmit differential signals from one component to another for communication within a luminaire. Thus, the structure as shown in FIG. 1 and FIG. 2 may be applied twice with defined and given distance between the 2 arrangements as it is shown in FIG. 3. The resulting transmission line 1' is then used for transmission of differential signals for communication between connected electronic components. The general structure of each individual transmission line attached to the same conductive housing component 2 is the same and, particularly, the dimensions of the individual and neighbouring transmission lines are the same as it can be seen in FIG. 3. The respective components are indicated with "a" and "b" in the drawing. It is to be noted that it is also possible to use a common dielectric layer for both conductors. Such an arrangement is particularly useful when the coating of the metallic housing component 2 shall be used as the dielectric layer.

Even more than two lines or three may be arranged adjacent to each other. For example, a central line and two ground lines may be arranged adjacent to each other and running in parallel, in order to achieve an improved signal guidance.

Figure 4:
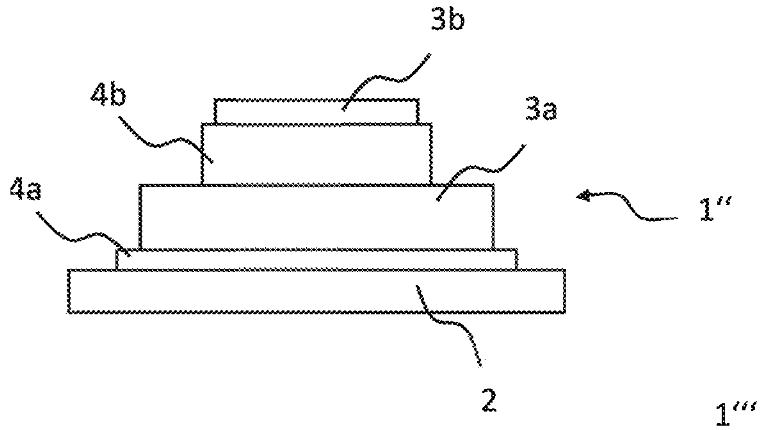
FIG. 4 shows a cross-section of the third embodiment adapted for transmitting a differential signal with stacked transmission lines, or transmitting with a second reference on top.

Another alternative for creating a transmission line 1" for transmitting differential signal is shown in FIG. 4. Again, two transmission lines are generated, the different components of which are marked as "a" and "b". However, this time the transmission lines are stacked thus arranging a second dielectric **4*b* on top of the first conductor 3*a*, followed by a second conductor 3*b***. It is apparent that due to the stacking the width of the successive layers stepwise decrease. Nevertheless, reasonable selection of the dielectric constants of the materials and also the further dimensions, namely the thicknesses of the layers allowed to adjust the overall impedance as desired.

All embodiments that have been explained so far make use of a single dielectric layer 4, 4*a*, 4*b*. However, application of a dielectric material can also lead to a plurality of dielectric sub layers, for example, in case that an adhesive tape 4T made of a dielectric material is attached to a coating 5 of the conductive housing component 2, which is already present at the end of manufacturing the respective housing part. Such an example is illustrated in cross-section of transmission line 1''' in FIG. 5. The conductive housing component 2 is coated with a coating layer 5 to which the dielectric tape 4T is then attached followed by the conductor 3. The coating 5 and the dielectric tape 4T both builds sub-layers of the entire dielectric layer and have to be considered when designing the microstrip, in particular the thicknesses of the involved dielectric material sub-layers-4T and 5.

Further, while the width of the coating 5 is not limited by the structure of the transmission line, because the coating 5 is attached to the entire conductive housing component 2 first and independent from the layers attached finally, the attached dielectric sublayer 4T does not need to have the same extension in the width direction as the coating 5 constituting the first sub-layer.

The so far explained transmission lines assume the dimension in the width direction of the ground plane constituted by the conductive housing component 2 to be infinite with its flat surface on top of which the dielectric layer 4 and the conductor 3 are attached. However, it might be desired to provide projections projecting from the same surface of the conductive housing component 2 besides the arrangement of the dielectric layer 4 and the conductor 3.

Figure 6:
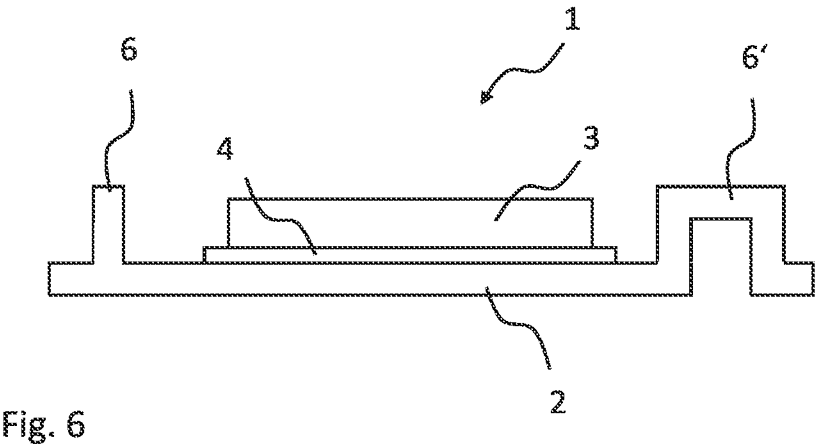
FIG. 6 shows a cross-section of a sixth embodiment with projections adjacent to a signal conductor of the transmission line for improvement of electrical characteristics of the transmission line.

Examples for such projections are shown in two different versions in FIG. 6. The left side of the arrangement of the dielectric layer 4 in the conductor 3 shows a projection 6 that may typically be formed when the conductive housing component 2 is made by extruding a metal, for example, aluminium for forming a metallic housing of a luminaire. On the right side in FIG. 6 an alternative version is illustrated, typically formed in case that a metallic housing of the luminaire is made by forming or deep drawing a metal sheet. The resulting projection 6' results in the same electrical characteristics of the transmission line as the projection 6, assumed that the distance between the edges of the conductor 3 and the respective projection 6, 6' is the same. Distance and height of such projection 6, 6' may be adjusted depending on the desired electrical characteristics of the resulting transmission line 1. Further, it is to be noted that the height of the projections is also not limited to be substantially equal to the overall height of the arrangement of the dielectric layer 4 and the conductor 3 but can also be adjusted according to the specific requirements. In particular, the projections may be formed by an adjacent wall of the housing of the luminaire.

Figure 5:
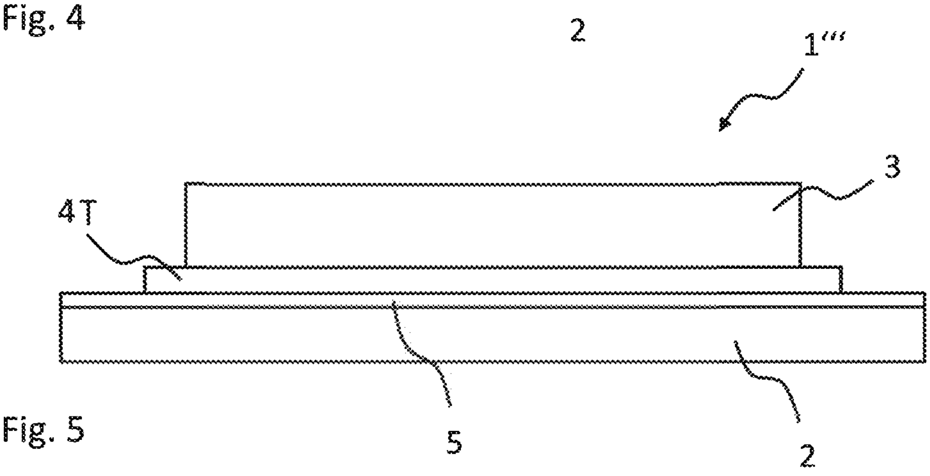
FIG. 5 shows a cross-section of a fourth embodiment using a multilayer dielectric between the conductor and the conductive housing component.

Although FIG. 6 illustrates the projections 6, 6' in combination with the simple form of a transmission line 1, it is evident that such projections 6, 6' may also be provided in combination with any of the other above explained embodiments of transmission lines illustrated in FIGS. 3 to 5.

Figure 7:
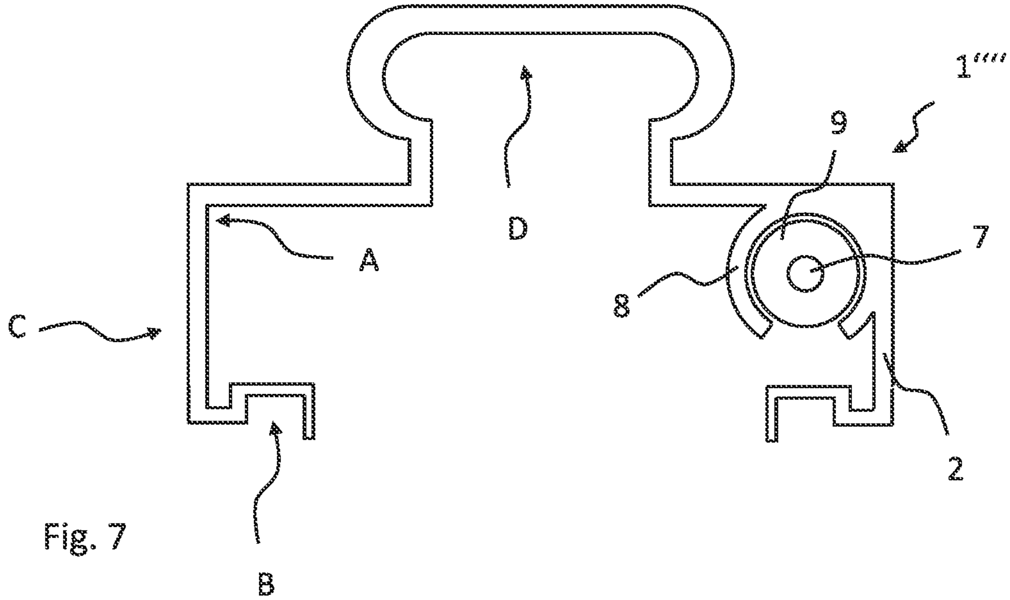
FIG. 7 illustrates the various positions at which the line can be attached to a housing of the luminaire and a further embodiment of a line formed as a 3D transmission line.

FIG. 7 schematically shows a cross-section of a lighting rail as an example of a housing for a luminaire. Such lighting track is known in the art and the plurality of such lighting tracks can be connected to each other in order to reach lengths of up to 100 m, for example. Such lengths are reached by connecting a plurality of modules (housings), whereby the connection of the modules does not necessarily connect the modules in only one dimension. Rather, various geometries of the connected modules can be used to generate different grid shapes, depending on circumstances in the building.

Preferred positions at which a transmission line according to one of the above-mentioned embodiments explained with reference to any of FIGS. 1 to 6 can be attached are indicated by characters "A", "B", "C" or "D". It is preferred to arrange the transmission line on an inside of the housing as indicated by A or D in case that the dielectric layer 4 and the conductor 3 are attached to the conductive housing component 2 during manufacturing of the luminaire. While the corrugation at position B and also the flat outer surface at position C may be used in the manufacturing process, it is evident that these positions are easily accessible even at a construction site after mounting the housing to generate a lighting structure in the building.

Attaching the dielectric layer 4 and the conductor 3 (or, of course, the plurality of dielectric layers and conductors as explained above with reference to the FIGS. 1 to 6) at the construction site has the advantage that a plurality of conductive housing components 2 may be mounted first to generate a modular housing and, then, the transmission line is generated by attaching the dielectric layer 4 and the conductor 3 extending over a plurality of connected conductive housing components 2.

In case that the arrangement of the conductive layer 4 and the conductor 3 is already applied in the manufacturing process, a connector is used in order to connect successive transmission lines established on individual modules.

FIG. 7 also illustrates a further embodiment of the transmission line 1'''' according to the present invention, which is built as a 3D-line with parts of the conductive housing component 2, indicated portion 8 at least partially surrounding a dielectric layer 9 enclosing a conductor 7. Since the sequence of the ground plane established by the conductive housing component 2 (including the projecting and surrounding portion 8), the dielectric layer 9 and the conductor 7 is still the same, it is evident that even in case of the 3D-line the conductor 7 and the conductive housing component 2 "sandwich" the dielectric layer 9.

It is to be noted that in the preferred and illustrated embodiment the dielectric layer 9 entirely encloses the conductor 7. However, for easier manufacturing the intermediates dielectric layer 9 may also only partially surround the conductor 7. The resulting structure resembles a coaxial line and provides comparable electrical characteristics.

Additionally or alternatively, the dielectric layer 9 may enclose the conductor 7 not along the full length of the conductor 7, but only in certain intervals in order to reduce losses. This may also achieve an improved transmission of signals at certain frequencies or frequency bands. This embodiment approximates, for example, dielectric layers formed like rings along the conductor 7.

It is also possible that, similar to the embodiments explained above, an adhesive tape is used as the dielectric layer 9 with the conductor 7 attached to the adhesive tape. The adhesive tape is then applied to the inside of a cavity created by the portion 8 of the conductive housing component 2. Similar to the explanations given above with reference to FIG. 6, such portions 8 of the conductive housing component 2 may positively influence the electrical characteristics of the resulting line for transmitting communication signals in the housing of the luminaire.

The luminaire using the conductive housing component 2 comprises one or more electronic components, not shown in the figures. The electronic components may serve different purposes in the luminaire or a lighting system. Apparently, the electronic component may be used for controlling an light source of the luminaire. For transmitting or receiving communication signals, the electronic component contacts the conductor 3 so that the transmission line 1 is used for transmitting and receiving communication signals. The transmission of communication signals may be performed between a plurality of electronic components of the same luminaire but also between electronic components arranged in different parts for different luminaires.

An electronic component may also be a transceiver coupled to the transmission line according to the invention and capable of transmitting and receiving signals via different communication channels, for example, wirelessly with remote further electronic components. The transmission lines 1, 1', . . . as illustrated and explained above are preferably used to establish a bus system within a lighting arrangement such as a light track.

Figure 8:
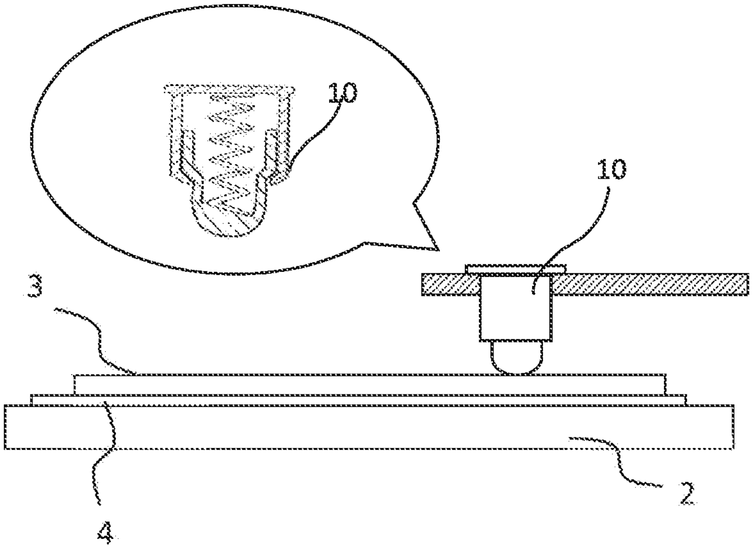
FIG. 8 illustrates a technique and a contacting element for contacting a transmission line using a spring loaded metal pin.
Figure 9:
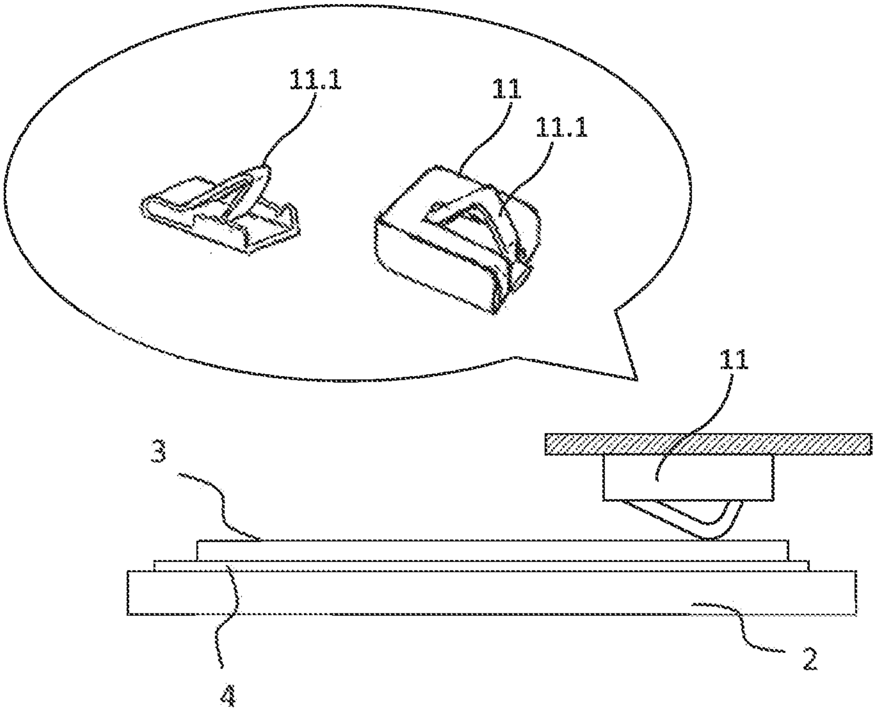
FIG. 9 illustrates a further contacting element using a metal spring for contacting a transmission line.

For contacting the conductor 3, 3*a*, 3*b* established techniques may be used like an elastic metal contact (spring contact), a conductive glue, or a mechanical solution like a spring arrangement pressing a contacting pin on the surface of the conductor 3, 3*a*, 3*b*. FIGS. 8 and 9 illustrate techniques for contacting the conductor 3, 3*a*, 3*b*. Those techniques are generally known in the art. Using these contacting elements in combination with the transmission line 1 enables connecting signal sources (transmitter) and signal sinks (receiver) for the high frequency signal transmitted over the transmission line 1 to the conductor 3, 3*a*, 3*b* of the transmission line 1.

Alternatively or additionally, the contacting elements may connect the conductors 3, 3*a*, 3*b* of individual luminaires with each other in order to achieve transmission of high frequency signals over increased distances and a plurality of luminaires.

FIG. 8 illustrates a technique for contacting a transmission line using a spring loaded metal pin 10 as the contacting element. A suitable spring loaded metal pin 10 is sold under the brand name Pogo Pin™.

FIG. 9 illustrates an alternative technique for contacting a transmission line using a metal spring 11.1 arranged in a contacting assembly 11 as an alternate embodiment of a contacting element.

With the conductors 3, 3*a*, 3*b*, 7 shown in FIGS. 1 to 9, electrical signals are transmitted from a first electronic component (first contacting element) to a second electronic component (second contacting element), wherein the conductor 3, 3*a*, 3*b*, 7 is a part of the transmission line formed by the dielectric layer 4, 4*a*, 4*b*, 9, the conductor 3, 3*a*, 3*b*, 7 and the ground plane of the conductive housing component 2.

Alternatively or in addition, at least one conductor 3, 3*a*, 3*b*, 7 arranged on the conductive housing component 2 via the dielectric layer 4, 4*a*, 4*b*, 9 as shown in FIGS. 1 to 9 can be an antenna element. The antenna comprising the antenna element(s) is placed inside or outside the housing and is configured to transmit and/or receive signals.

The antenna can be a monopole antenna, a dipole antenna or a patch antenna, wherein the conductive housing component 2 serves as the ground plane of the antenna and the one or more conductors 3, 3*a*, 3*b*, 7 are arranged linear, rectangular, circular and/or triangular on the dielectric layer 4, 4*a*, 4*b*, 9.

The conductors 3, 3*a*, 3*b*, 7 of the antenna can be connected to an electronic component or a connection cable by the contacting element shown in FIG. 8 or 9. Alternatively, the antenna can be (seamlessly) connected to a transmission line formed by the conductors 3, 3*a*, 3*b*, 7, whereas the transmission line is connected to the electronic component.

Figure 10:
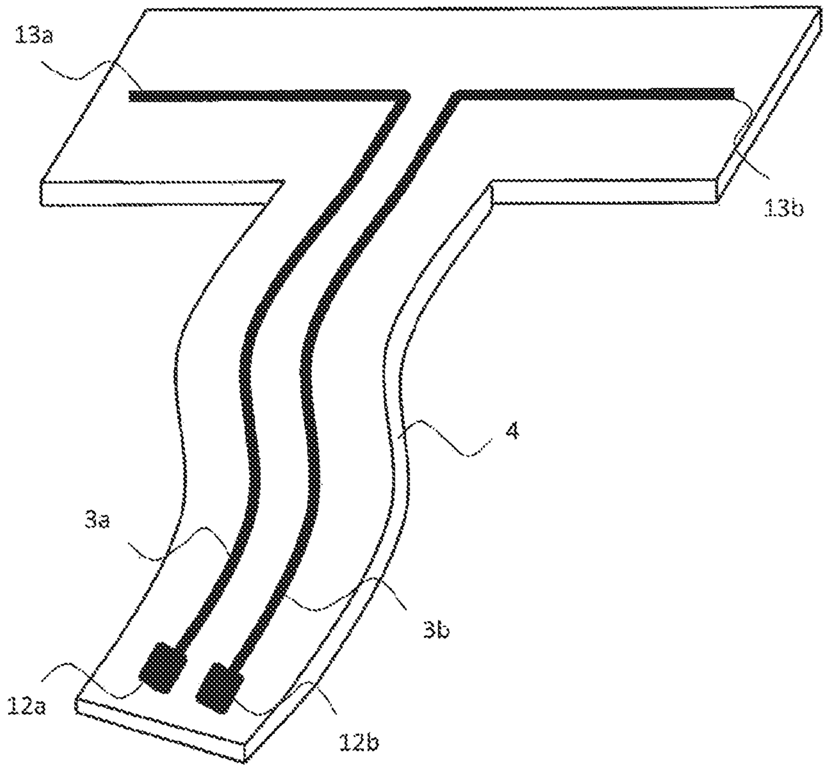
FIG. 10 shows an antenna attachable to the housing according to the invention.

FIG. 10 shows a perspective illustration of a dipole antenna in the form of an adhesive pad attachable to the inside or outside of the conductive housing component 2. The pad is formed of a flexible material and comprises the dielectric layer 4, which is a single-sided adhesive tape, and two conductors 3*a*, 3*b* fixed on the dielectric layer 4. Each conductor 3*a*, 3*b* comprises an electrical contact 12*a*, 12*b* formed at its free end and one of the two antenna elements 13*a*, 13*b* formed at its other end. The electrical contacts 12*a*, 12*b* provide an increased contact surface for the contacting elements. The part of the pad including the electrical contacts 12*a*, 12*b* can be inserted into the housing, whereas the part including the two antenna elements 13*a*, 13*b* can be attached to the outside of the housing.

After the dipole antenna shown in FIG. 10 is attached to the conductive housing component 2, the housing inclusive of the antenna can be coated (powder coating, spray painting, or anodizing) to produce uniform colouring and/or to provide a further dielectric layer on the top of the two conductors 3*a*, 3*b* that are arranged on the dielectric layer 4.

Figure 11:
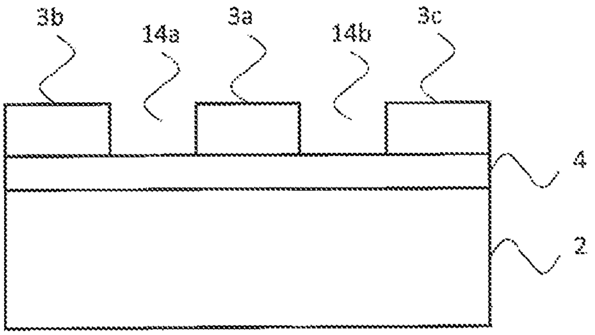
FIG. 11 shows a cross-section of a seventh embodiment of a line formed as a coplanar waveguide.

FIG. 11 shows a cross-section of a transmission line formed as a coplanar-backed waveguide using the conductive housing component 2. The transmission line consists of a first conductor 3*a* arranged on the dielectric layer 4, together with a pair of return conductors 3*b*, 3*c*, one to either side of the first conductor 3*a*, and the conductive housing component 2 serving as a third return conductor. All three conductors 3*a* . . . 3*c* are on the same side of the dielectric layer 4, and hence are coplanar, wherein the conductive housing component 2 covers the entire back-face of the dielectric layer 4. The return conductors 3*b*, 3*c* are separated from the central first conductor 3*a* by a respective gap 14*a*, 14*b*, which has an unvarying width along the length of the transmission line.

The housing or the conductive housing component 2 shown in FIGS. 1 to 9 and 11 is a housing/housing component of a luminaire. Alternatively, the housing can be a housing of an operating device for an illuminant (e.g. a LED driver or a ballast for fluorescent lamps), a LED module or a sensor device.

The invention claimed is:

1. A housing for a luminaire or an operating device for the luminaire, the housing being configured to accommodate at least one electronic component and/or a light source, and comprising a conductive housing component (2), wherein the housing includes at least one line (1, 1', 1", 1'", 1"") for transmitting electric high frequency signals or for transmitting and/or receiving radio waves, wherein the at least one line (1, 1', 1", 1'", 1"") is formed by arranging a dielectric layer (4, 4*a*, 4*b*, 9) and a conductor (3, 3*a* . . . 3*c*, 7) on the conductive housing component (2) such that the conductive housing component (2) serves as a ground plane, and the conductive housing component (2) and the conductor (3, 3*a* . . . 3*c*, 7) sandwich the dielectric layer (4, 4*a*, 4*b*, 9); and wherein the dielectric layer (4, 4*a*, 4*b*, 9) is at least partially applied in form of an adhesive tape attached to the conductive housing component (2).

2. The housing according to claim 1, wherein the dielectric layer (4, 4*a*, 4*b*, 9) is at least partially established by a coating material.

3. The housing according to claim 1, wherein a part of the conductive housing component surrounds the dielectric layer at least partially in cross section and the dielectric layer surrounds the conductor (3, 3 . . . 3*c*, 7) at least partially in cross section.

4. The housing according to claim 1, wherein the adhesive tape carries the conductor (3, 3 . . . 3*c*, 7) or the conductor (3, 3 . . . 3*c*, 7) comprises an adhesive coating.

5. The housing according to claim 1, wherein the conductor (3, 3 . . . 3*c*, 7) is applied by metal deposition, drawing conductive ink or attaching a metal foil.

6. The housing according to claim 1, wherein the conductor is a first conductor (3*a*) and dielectric layer is a first dielectric layer (4*a*) and the first dielectric layer (4*a*) and a second dielectric layer sandwich the first conductor (3*a*) and a second conductor (3*b*) is on the second dielectric layer (4*b*).

7. The housing according to claim 1, wherein the conductive housing component (2) comprises a flat section to which the dielectric layer and the conductor are attached so as to establish a transmission line and/or an antenna.

8. The housing according to claim 7, wherein the antenna is a dipole antenna (13*a*, 13*b*).

9. The housing according to claim 7, wherein the transmission line is connected to the antenna.

10. The housing according to claim 7, wherein the transmission line forms a coplanar waveguide, in which the conductor (3, 3*a* . . . 3*c*, 7) together with a pair of return conductors (3, 3*a* . . . 3*c*, 7) sandwiching the conductor (3, 3*a* . . . 3*c*, 7) are arranged on the same side of the dielectric layer (4, 4*a*, 4*b*, 9) and the conductive housing component (2) serves a third return conductor.

11. The housing according to claim 7, wherein said transmission line is one of a plurality of transmission lines that are arranged stacked or side by side.

12. The housing according to claim 7, wherein a projection (6, 6') is formed on the conductive housing component (2) projecting from the flat section from the same surface to which the dielectric layer and the conductor are attached.

13. The housing according to claim 7, wherein the conductive housing component is one of a plurality of conductive housing components, each comprising a respective dielectric layer on the conductive housing component and a respective conductor on dielectric layer, and the plurality of conductive housing components (2) are arranged to form a common ground plane of the transmission line and to establish a common dielectric layer and a common conductor (3, 3 . . . 3*c*, 7) on the plurality of conductive housing components (2).

14. The housing according to claim 7, wherein at least one connector is provided for contacting the transmission line (1, 1', 1", 1'", 1"") and enabling another transmission line (1, 1', 1", 1'", 1"") and/or the at least one electronic component to connect to the transmission line (1, 1', 1", 1'", 1"") for feeding the transmission line (1, 1', 1", 1'", 1"") with a signal and/or receiving a signal from the transmission line (1, 1', 1", 1'", 1"").

15. A luminaire comprising a housing according to claim 7, and further comprising the at least one electronic component contacting the transmission line (1, 1', 1", 1'", 1"") for transmitting and/or receiving a signal.

16. The luminaire according to claim 15, wherein ground of the at least one electronic component is connected to the conductive housing component (2).

* * * * *